United States Patent [19]
Franson

[11] Patent Number: 5,568,149
[45] Date of Patent: Oct. 22, 1996

[54] A/D CONVERTER SUBSYSTEM WITH HALF LINEAR BUFFER AMPLIFIER

[75] Inventor: Alvin D. Franson, Scottsdale, Ariz.

[73] Assignee: Motorola, Inc., Schaumburg, Ill.

[21] Appl. No.: 518,734

[22] Filed: Aug. 24, 1995

[51] Int. Cl.⁶ .................................................. H03F 3/45
[52] U.S. Cl. ........................ 341/156; 341/159; 330/252
[58] Field of Search .................................. 341/156, 122, 341/159; 330/252; 329/560–563

[56] References Cited

U.S. PATENT DOCUMENTS

| | | | |
|---|---|---|---|
| 4,393,368 | 7/1983 | Rasmussen | 340/347 |
| 5,307,024 | 4/1994 | Metz et al. | 330/259 |
| 5,309,157 | 5/1994 | Yee | 341/156 |

Primary Examiner—Jeffrey A. Gaffin
Assistant Examiner—Peguy JeanPierre
Attorney, Agent, or Firm—Gregory J. Gorrie

[57] ABSTRACT

Differential signals are linearly amplified in a differential amplifier (16) and provided to a large dynamic range A/D converter (11). The differential amplifier (16) is optimized for linear performance for positive output signals at the expense of negative output signals. The A/D converter subsystem (10) provides up to a ten or twelve bit output and is fabricated on a single monolithic chip. A ten to twenty dB improvement in linearity is achieved over discrete designs. Power consumption is significantly reduced by operating the amplifiers over lower voltage ranges. The integration of an entire A/D subsystem (10) including high level amplification is achieved on a single chip.

20 Claims, 3 Drawing Sheets

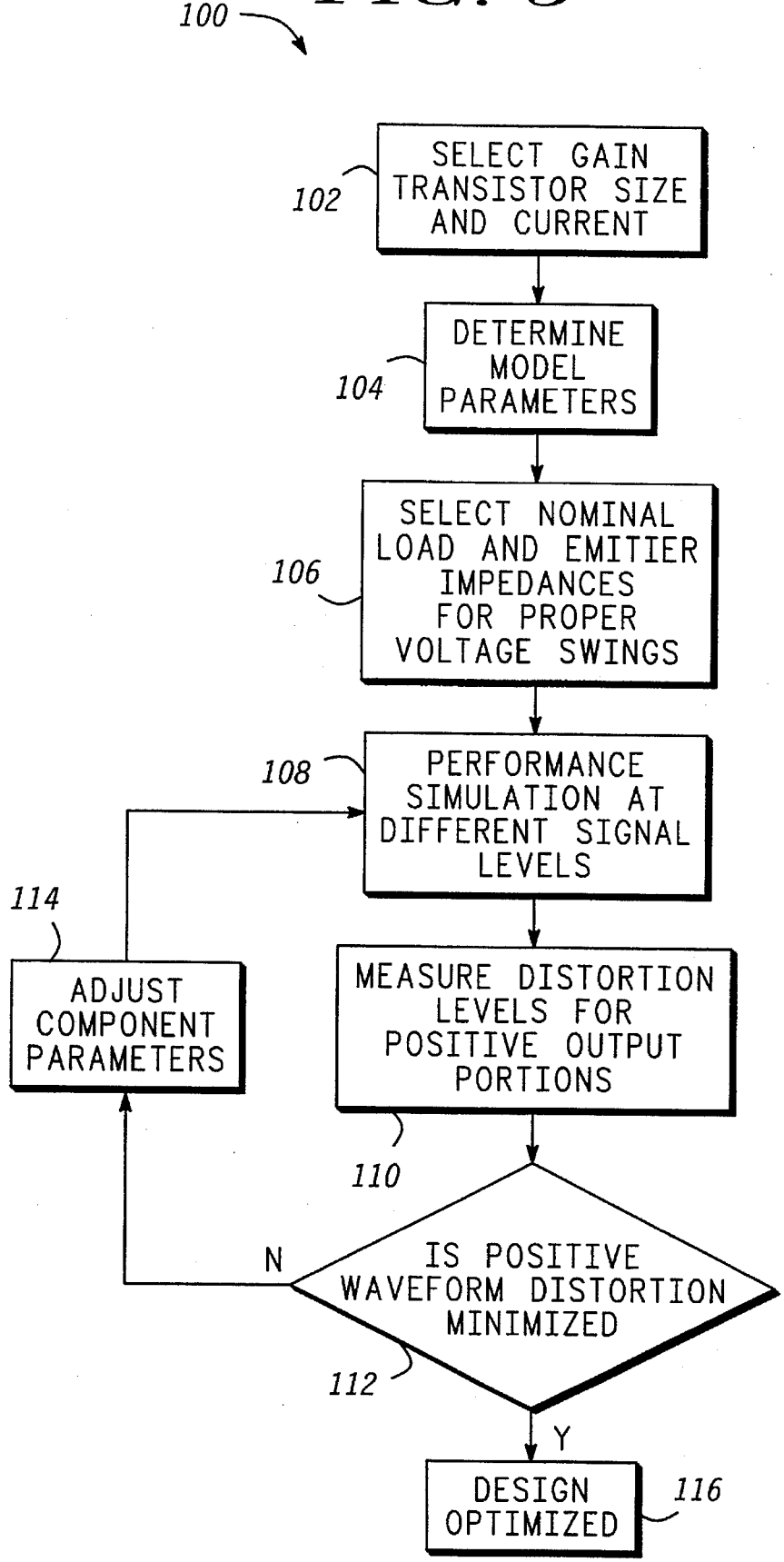

A/D CONVERTER SUBSYSTEM WITH HALF LINEAR BUFFER AMPLIFIER

FIELD OF THE INVENTION

This invention relates in general to the field of electronic circuits, in particular to linear differential amplifiers and more particularly to multi-threshold analog to digital (A/D) converters that have a very large dynamic range and use linear differential amplifiers.

BACKGROUND OF THE INVENTION

Analog to Digital (A/D) converters that have a very large dynamic range must be driven with high voltage analog signals having very low distortion to preserve their dynamic range. For example, A/D converters that produce ten or more bits must be driven with extremely linear amplifiers. Linearity in excess of 60 dB (equivalent to about 0.1 percent distortion) is required for a ten-bit A/D converter. This sort of linearity is very difficult to obtain over required typical voltage ranges, such as one to two volts. This is especially difficult when low power consumption and high sampling rates are desired.

Thus what is needed is an A/D converter subsystem with a very large dynamic range. What is also needed is an A/D converter subsystem that does not have to be driven with high voltage analog signals to achieve high linearity. What is also needed is an A/D converter subsystem that uses less power, and can be fabricated on a single monolithic chip.

BRIEF DESCRIPTION OF THE DRAWINGS

FIG. 3 is a flow chart of a procedure for optimizing performance of a half-linear buffer amplifier in accordance with a preferred embodiment of the present invention.

DETAILED DESCRIPTION OF THE DRAWINGS

The examples of the preferred embodiment described herein provide an A/D converter with a ten-bit quantization, however the invention applies to A/D converters with any number of bits. The present invention provides, among other things, an analog to digital (A/D) converter subsystem that has a very large dynamic range. The present invention also provides an A/D converter subsystem that does not have to be driven with high voltage analog signals to achieve high linearity. The present invention also provides an A/D converter subsystem that uses less power, and can be fabricated on a single monolithic chip. In the preferred embodiments of the present invention, differential signals are linearly amplified in a differential amplifier and provided to a large dynamic range A/D converter. The differential amplifier is optimized for linear performance for positive output signals at the expense of negative output signals. Because of the extremely linear output of the differential amplifier, the A/D converter subsystem can provide an accurate ten or twelve bit output word. In the preferred embodiment, the A/D converter subsystem is fabricated on a single monolithic chip. A 10 to 20 dB improvement in linearity is achieved over discrete designs. Power consumption is significantly reduced by operating the amplifiers over lower voltage ranges.

Figure 1:
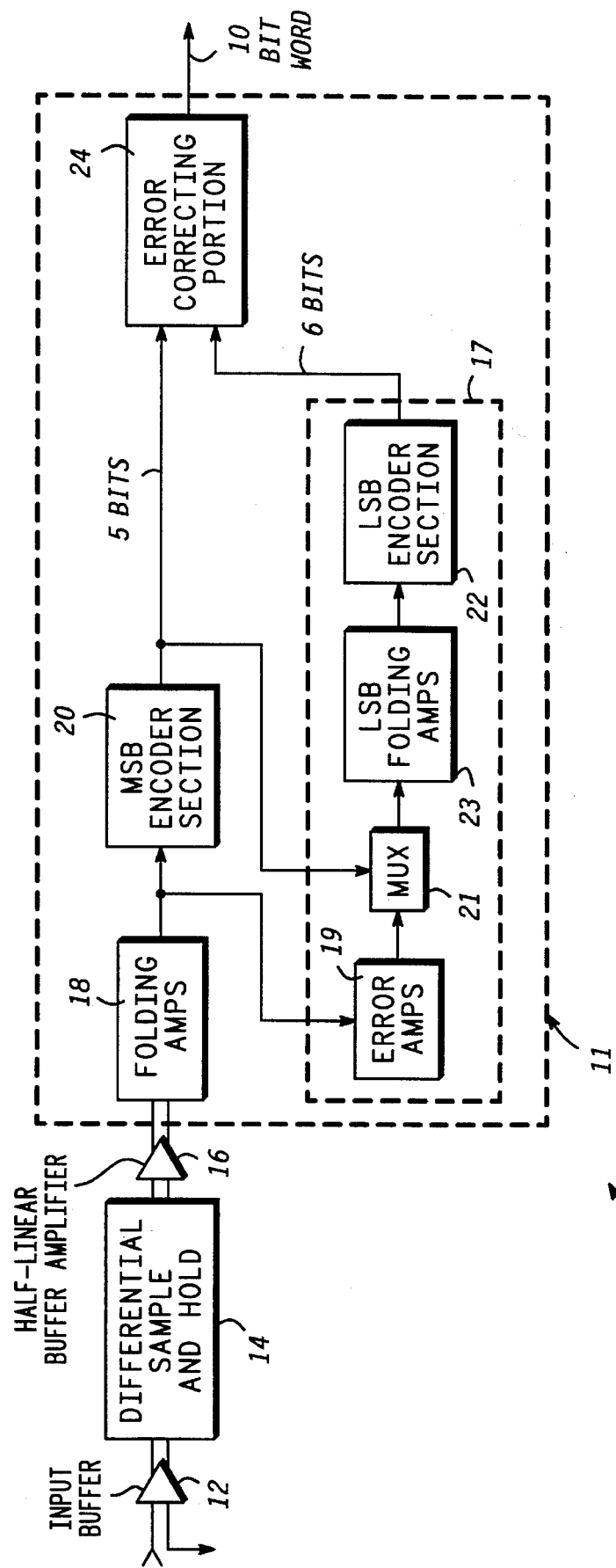
FIG. 1 is a highly simplified functional block diagram of an analog to digital converter subsystem in which the present invention may be practiced.

FIG. 1 is a highly simplified functional block diagram of an analog to digital converter subsystem in which the present invention may be practiced. Analog to digital (A/D) converter subsystem 10 includes input buffer 12. Input buffer 12 receives an analog input signal generally from an output of a receiver. Preferably, the analog input signal is a single ended input signal such as an AC coupled IF signal or a baseband converted signal. An AC coupled signal, for example, may have a bandwidth of 50 MHz and be centered at 50 MHz. A baseband signal may range, for example from zero to 100 MHz. Input buffer 12 preferably has unit gain and provides differential output signals that are approximately 180 degrees out of phase referenced to a common ground. In the preferred embodiment, the analog signal provided to input buffer 12 is around 0 dBm or 0.6 volt peak-peak.

Input buffer 12 is coupled to sample and hold circuit 14. Sample and hold circuit 14 samples the differential output signals provided by input buffer 12, preferably at some clock rate. The clock rate is preferably around 100 MHz, but clock rates between 10 MHz and 200 MHz are suitable. Those of skill in the art understand that the maximum clock rate significantly depends on the integrated circuit processes by which A/D converter subsystem 10 is fabricated. The clock circuitry may be internal to sample and hold circuit 14, or may be provided from another source in the system. One purpose of sample and hold circuit 14 is to hold the signal during processing so that the same point in time of the signal is processed throughout the A/D stages. Preferably, the signal is held for one clock cycle wherein the clock rate is no greater than the processing time for A/D converter subsystem 10. Sample and hold circuit 14 provides output signals on two differential outputs (i.e., 180 degrees apart). The output of sample and hold circuit 14 represents a sampled input voltage for a single clock cycle.

Sample and hold circuit 14 provides differential output signals to half-linear buffer amplifier 16. Half-linear buffer amplifier 16 amplifies the differential outputs of sample and hold circuit 14. In the preferred embodiment, half-linear buffer amplifier 16 is a differential-type amplifier such that voltage offsets and signal noise on the input signal are canceled. Preferably, half-linear buffer amplifier 16 differentially and linearly amplifies its input signal by a factor of at least 10. In the preferred embodiment, the output of half-linear buffer amplifier 16 is a three volt peak-to-peak signal on each of its complimentary outputs.

Half-linear buffer amplifier 16 provides two differential output signals to A/D converter portion 11 of A/D converter subsystem 10. A/D converter portion 11 includes input folding amplifiers 18, most significant bit (MSB) encoder section 20, least significant bit (LSB) portion 17, and error correcting portion 24. LSB portion preferably includes error amplifiers 19, multiplexer (MUX) 21, least significant bit (LSB) encoder section 22, and LSB folding amps 23. A suitable A/D converter portion has been described in U.S. Pat. No. 4,393,368, entitled "MULTITHRESHOLD A/D CONVERTER UTILIZING ERROR AMPLIFIERS" assigned to the same assignee as the present application. This patent is incorporated herein by reference.

Input folding amplifiers 18 preferably include eight individual folding amplifiers in a parallel configuration and provide a half reduction in input voltage. Each folding amplifier conducts when its input is positive. In the preferred embodiment, input folding amplifiers 18 provide a one-half reduction in the voltage range needed for the comparators in MSB encoder section 20. Preferably, the input of the folding amplifiers is three volts peak to peak complimentary which results in a one and a half volt ladder range for the comparators.

MSB encoder section 20 includes a sign bit comparator and preferably a four bit flash that uses sixteen parallel comparators. The sixteen parallel comparators are preferably arranged in a ladder-type configuration so that each of the comparators in the ladder are referenced to a different reference voltage. The reference voltages for the comparators preferably range from zero to one and a half volts. MSB encoder section 20 provides five bits (the sign bit and the four flash bits) to error correcting portion 24. The five bits are also provided to LSB portion 17.

Error amplifiers 19 of LSB portion 17 provide a sample of the input signal referenced to a ladder voltage. Multiplexer (MUX) 21 addresses one of the outputs of the error amplifiers based on the bits provided by MSB encoder section 20. LSB folding amps 23 include a plurality of folding amplifiers similar to input folding amplifiers 18. Preferably, LSB folding amps 23 includes 16 folding amplifiers that respond only to the positive portion of their input signal. LSB folding amps 23 provide a single ended waveform to LSB encoder section 22.

LSB encoder section 22 includes a sign bit comparator and preferably a five bit flash that uses thirty-two parallel comparators. The thirty-two parallel comparators are preferably arranged in a ladder-type configuration so that each of the comparators in the ladder are referenced to a different reference voltage. The reference voltages for the comparators preferably range from zero to a half volt, although other reference voltage ranges are suitable. LSB encoder section 22 produces six bits (the sign bit and the five flash bits). Error correcting portion 24, among other things, combines these six bits with the five bits provided by MSB encoder section 20 into one ten-bit word.

In general, MSB encoder section 20 provides sixteen bins of information, i.e., one bin from each comparator. The MSB encoder directs the multiplexer to pick one of the bins which is converted by the LSB encoder portion. Preferably, LSB encoder section 22 encodes over the adjacent +/−half bin plus the selected bin from the MSB decision. This alleviates the required accuracy in the MSB decision.

The decision for MSB encoder section 20 is preferably made at the end of the first half clock cycle, while the decision for LSB encoder section 22 is preferably made at the end of the second half clock cycle. Those of skill in the art will understand that there will be a small setup delay for the output data to be valid. However, during this delay time, the next sample is processed.

In the preferred embodiment of the present invention, A/D converter subsystem 10 is fabricated on a single chip, preferably in monolithic form. Preferably, a silicon bipolar half-micron fabrication process is used.

Figure 2:
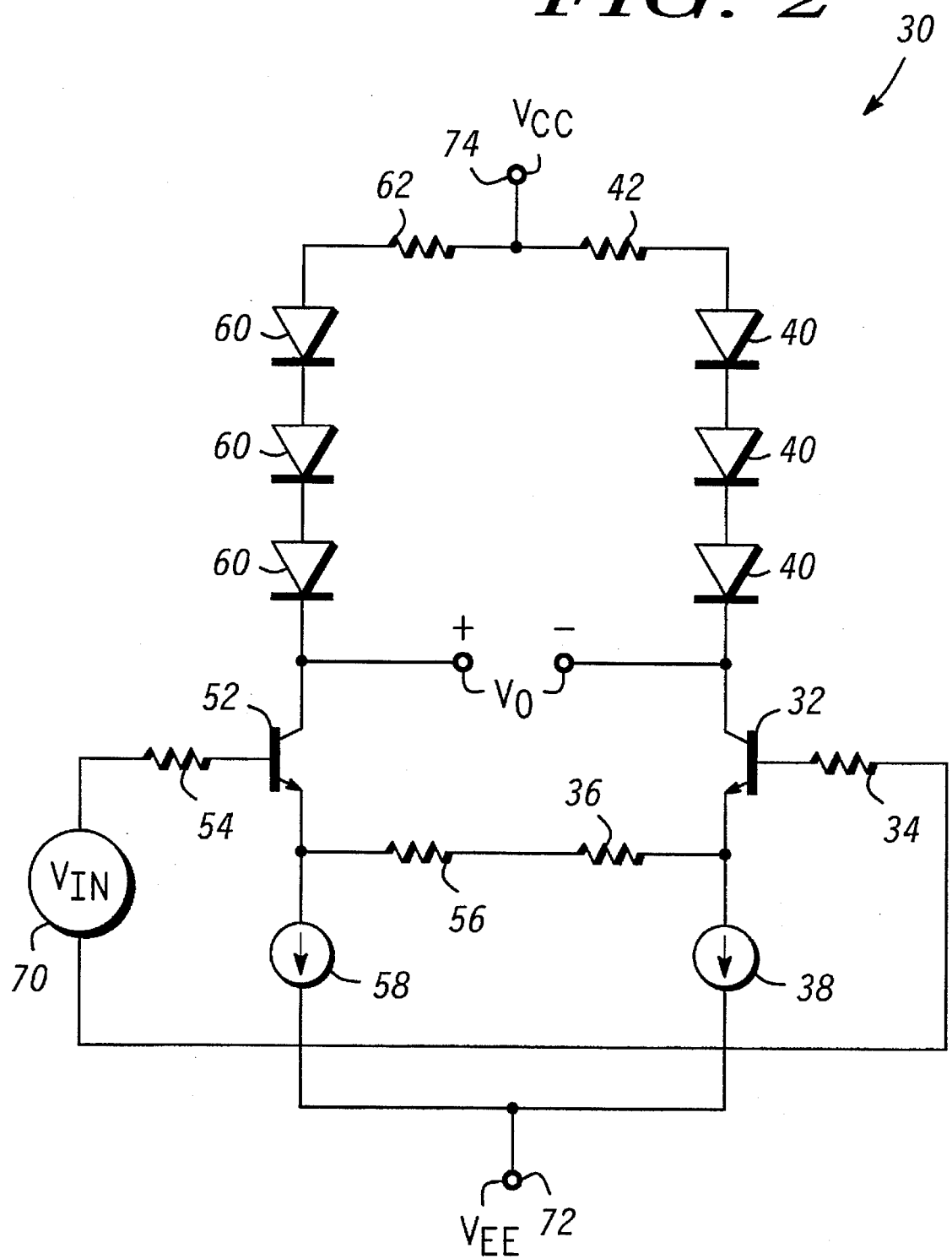
FIG. 2 is simplified schematic diagram of a half-linear buffer amplifier in accordance with a preferred embodiment of the present invention.

FIG. 2 is simplified schematic diagram of a half-linear buffer amplifier in accordance with a preferred embodiment of the present invention. Half-linear buffer amplifier 30 shown in FIG. 2 is suitable for use in A/D converter subsystem 10 as half-linear buffer amplifier 16. Half-linear buffer amplifier 30 is a differential amplifier that include diodes 40, 60 in each of the collector legs. Half-linear buffer amplifier 30 includes transistors 32, 52, emitter resistors 36, 56, base resistors 34, 54 and load resistors 42, 62. Half-linear buffer amplifier 30 also includes current sources 38, 58 and is supplied with supply voltages Vcc 74 and VEE 72. For clarity of explanation, only a one stage differential amplifier is shown in FIG. 2. In the preferred embodiment, half-linear buffer amplifier 30 includes several stages of amplifiers.

Half-linear buffer amplifier 30 provides signals for input folding amplifiers 18 (FIG. 1) which respond only to positive portions of their input and ignore negative portions of their input. Therefore, half-linear buffer amplifier 30 provides an extremely linear output signal for positive portions of the signals. It is not important whether the negative portions of the signals are linearly amplified. Half-linear buffer amplifier 30 is preferably optimized for positive output signals, desirably at the expense of the negative output signals.

Those of skill in the art will understand that although in the preferred embodiment of the present invention, as described herein, half-linear buffer amplifier is optimized for positive output signals, the invention is suitable for designs which require negative going signals. Accordingly, half-linear buffer amplifier would be optimized for negative output signals.

The performance parameters for half-linear buffer amplifier 30 are listed below in Table I for a preferred embodiment of the present invention. These parameters are listed below for illustrative purposes only, and those of ordinary skill in the art know how to choose suitable parameters based on a specific application.

TABLE I

| | |
|---|---|
| Input voltage | 0.6 v pk-pk differential |
| Output voltage | 3.0 v pk-pk complimentary |
| Output Offset | −1.5 v Nominal DC |
| | +/−0.03 v variation |
| | (single ended) |
| | +/−0.01 v differential |
| Load Capacitance | 0.2 pf |
| Input Frequency | 1 MHz to >200 MHz at 3 dB |
| Input Current | <5 nA |
| Source Impedance | 0.5 pf Hold capacitance |
| | 200 Ohms tracking |
| Gain Distortion | <0.1% for positive outputs |
| DC Power | <0.25 watts |

The input current is driven by the value of the input hold capacitor and lowest sampling rate. In the preferred embodiment, design goals are 0.5 pf and one MSPS. The droop allowable is also driven by the number of bits. The case of ten bits requires less than 0.05 percent (½ LSB) droop. The five nano-amp input requirement is achieved in a Darlington configuration. Circuit modeling using foundry parameters indicates good beta down to 0.5 micro-amps collector current at a 125 degrees C junction temperature. The modeled leakage currents are in the order of $10^{-14}$ amps which is more than adequate. The smallest standard device is 2.2 micrometers, and a gain of ten is chosen to limit the signal level in the sampler to 0.30 volt peak and yield complimentary 3 volt-peak to peak output signals. The output signal is preferably DC coupled to the A/D converter portion. Any DC offset degrades the dynamic performance of the system. Excessive offset causes missing codes to occur. The preferred embodiment uses a Darlington input and emitter follower buffers followed by two gain stages. The output is buffered with another emitter follower. Two gain stages were chosen for improved frequency response over a single stage. Also better linear compensation with diodes is achieved at lower gains. The linearity is optimized using a spreadsheet analysis of DC gain (see FIG. 3). The model includes non-linear emitter and base resistances which are compensated by the collector load diodes. The ratio of linear to non-linear resistances in the gain equations are optimized for large signal operation. The first stage operates at approximately 0.3 current ratio at maximum signal, while the output stage is at 0.7. The output stage generally sets the overall distortion. The current ratio is the ratio of AC signal swing to DC bias level.

The technique used to linearize uses diodes as part of the amplifier's load resistance. One to three diodes are desired for linearizing the positive signal swing. The effects of Vbe verses temperature for load diodes and output emitter followers are compensated using a temperature compensating voltage regulator. This regulator is also used to power the stage one collector which compensates about half of the diode drops in the circuit. This is adequate for stage one since the voltage swings are less, and it does not affect the output DC offset.

The load is buffered with an emitter follower. Using a constant current source and high impedance load, no distortion will result. However, capacitive loading will introduce distortion caused by the non-linear $V_{be}$ drop over the AC wave form cycle. Thus the current source bias is selected at a high value such as two milli-amps to keep the distortion below 60 dBc. The load capacitance is a significant consideration. The folding amplifiers input capacitance is estimated about sixteen femtofarads. A load of eight folding amplifiers and miscellaneous track capacitance is estimated at 200 femtofarads. The 10-bit accuracy for three volt peak to peak output requires less than three milli-volt Vbe range. It can be shown that three milli-volts Vbe represents approximately a ten percent emitter current change. At a 50 MHz signal rate, a 200 femtofarad capacitor requires about 0.2 mA AC current for three volts of signal. Thus, the bias should be about ten times this or 2 mA. A higher operating frequency or larger load capacitance requires even higher output current. In the preferred embodiment, this amplifier handles frequencies up to at least 50 MHz with 100 MSPS conversion.

FIG. 3 is a flow chart of a procedure for optimizing performance of a half-linear buffer amplifier in accordance with a preferred embodiment of the present invention. Procedure 100 is performed during the design of a half-linear buffer amplifier and may be performed by a circuit designer through use of properly configured circuit simulators well known in the art.

In task 102, an initial starting position of circuit design is chosen. For example, parameters such as gain, transistor size and operating current are chosen for the half-linear buffer amplifier. These parameters are preferably based on the fabrication process by which the A/D converter subsystem will be built. For example, in the preferred embodiment, a voltage gain of three is initially selected. In general, for a voltage gain of three, three diodes 60 and three diodes 40 should be selected. The operating current is determined in part by the bandwidth of the input signal. In general, a wider bandwidth will require more current.

The transistor size is initially determined by the frequency of operation, voltage levels and the desired number of bits that will be handled. Diodes 40 and 60 are preferably the same as transistors 32 and when half-linear buffer amplifier 30 is fabricated on a single chip. Preferably, transistors 32 and 52 are matched.

In task 104, the model parameters for the transistors and diodes are determined. In the preferred embodiment, the model parameters are based on the specific fabrication process and include the process characteristic. For example, a transistor beta model that varies with current is preferably used. This is important so that a minimum of 60 dB linear range can be achieved.

In task 106, nominal load and emitter impedances (e.g., resistors 42, 62, 36 and 56) are selected for proper or desired voltage swings. The voltage swings depend on the gain of the transistors and accuracy of the comparators.

In task 108, performance is simulated over a range of input signal levels. This task is preferably performed using a circuit simulator.

In task 110, separated distortion levels are measured for the positive output signal and the negative output signal portions. Preferably, distortion levels are measured from zero input signal to a maximum signal level are compared. For example, full on to full off.

Task 112 determines if the distortion level for the positive output signal portion is minimized. Initially, the first time through procedure 100, the distortion level for the positive output signal portion would not be minimized. When the distortion level for the positive output signal portion is not minimized, task 114 is performed. Some circuit simulators are generally not suitable for task 112 because their distortion output is based on an average distortion for both sides of the waveform. Those of skill in the art should be able to choose an appropriate circuit simulator.

In task 114, circuit component parameters are adjusted to help minimize distortion for the positive output signal portion, preferably at the expense of the negative output portion. Tasks 108–114 are an iterative process wherein the circuit parameters are changed until distortion in the positive output signal portion is minimized over all input signal levels. If the performance of tasks 108–114 does not result is satisfactory linear performance, tasks 102–106 may be repeated for a different gain, transistor size or current.

When task 112 determines that the distortion level for the positive output signal portion is minimized, task 116 is performed. In task 116, the design optimization procedure is complete and the circuit may be fabricated.

Thus, an A/D converter subsystem has been described which overcomes specific problems and accomplishes certain advantages relative to prior art methods and mechanisms. The improvements over known technology are significant. For example, the A/D converter subsystem of the present invention has a very large dynamic range and that does not have to be driven with high voltage analog signals to achieve high linearity. Furthermore, the A/D converter subsystem of the present invention uses less power, and can be fabricated on a single monolithic chip. In addition, the differential amplifier used in a preferred embodiment of the present invention is optimized for linear performance for positive output signals at the expense of negative output signals. Because of the extremely linear output of the differential amplifier, the A/D converter subsystem can provide an accurate ten or twelve bit output word. In the preferred embodiment, the A/D converter subsystem is fabricated on a single monolithic chip. As a result, a 10 to 20 dB improvement in linearity is achieved over discrete designs. Power consumption is significantly reduced by operating the amplifiers over lower voltage ranges.

The foregoing description of the specific embodiments will so fully reveal the general nature of the invention that others can, by applying current knowledge, readily modify. and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. An A/D converter subsystem for converting an analog signal to digital words comprising:

a sample and hold circuit for sampling said analog signal and providing first and second differential signals, said differential signals being substantially out of phase, each differential signal having a positive going portion and a negative going portion;

a half-linear buffer amplifier for linearly amplifying said positive going portion of said differential signals and non-linearly amplifying said negative going portion of said differential signals, said half-linear buffer amplifier providing first and second differential output signals that are substantially out of phase, said differential output signals having a positive going portion and a negative going portion;

a plurality of folding amplifiers in a parallel configuration for amplifying said positive going portion of said differential output signals, said each of said folding amplifiers providing a single ended output signal based on said positive going portion of said differential output signals;

a most significant bit (MSB) encoder section for providing most significant output bits based on each of said single ended output signals; and a least significant bit (LSB) encoder section for providing least significant output bits based on said most significant output bits and said each of said single ended output signals.

2. An A/D converter subsystem as claimed in claim 1 wherein said half-linear buffer amplifier has a linearity with less than 0.1 percent distortion.

3. An A/D converter subsystem as claimed in claim 1 wherein each of said plurality of folding amplifiers conducts for said positive going portion of said differential output signals and does not conduct for said negative going portion of said differential output signals.

4. An A/D converter subsystem as claimed in claim 3 further comprising an error correcting portion for combining said most significant output bits and said least significant output bits to produce a ten bit word output.

5. An A/D converter subsystem as claimed in claim 4 wherein:

said MSB encoder section provides a five bit word;

said LSB encoder section provides a six bit word; and said error correcting portion combines said five bit word and said six bit word to produce a ten bit word output.

6. An A/D converter subsystem as claimed in claim 5 wherein said sample and hold circuit samples at a rate ranging between 10 MHz and 200 MHz.

7. An A/D converter subsystem as claimed in claim 5 wherein said half-linear buffer amplifier is a multistage differential-type amplifier that includes transistors and having collector load diodes that compensate in part for non-linearities of said transistors, said half-linear buffer amplifier fabricated on a single monolithic substrate wherein said transistors are substantially identical.

8. An A/D converter subsystem as claimed in claim 7 further comprising an input buffer that provides said analog signals to said sample and hold circuit.

9. An A/D converter subsystem as claimed in claim 8 wherein said half-linear buffer amplifier linearly amplifying said positive going portion of said differential signals within 0.10 percent.

10. A method of converting analog signals to digital signals comprising the steps of:

providing an analog input signal;

sampling said analog input signal to provide first and second differential signals, said differential signals being substantially out of phase, each differential signal having a positive going portion and a negative going portion;

linearly amplifying said positive going portion of said differential signals and non-linearly amplifying said negative going portion of said differential signals to provide first and second differential output signals that are substantially out of phase, said differential output signals having a positive going portion and a negative going portion;

amplifying said positive going portion of said differential output signals to provide a single ended output signal based on said positive going portion of said differential output signals;

producing most significant output bits based on said single ended output signal; and producing least significant output bits based on said most significant output bits and said single ended output signal.

11. A method as claimed in claim 10 further comprising the step of combining said most significant output bits and said least significant output bits to produce a ten bit word output.

12. A method as claimed in claim 11 wherein:

the step of producing said most significant output bits comprises the step of producing a five-bit output word;

the step of producing said least significant output bits comprises the step of producing a six-bit output word; and the combining step comprises the step of combining said five-bit output word and said six-bit output word to produce a ten bit word output.

13. A method as claimed in claim 12 further comprising the step of sampling said analog input signal at a rate ranging between 10 MHz and 200 MHz.

14. A method as claimed in claim 13 wherein the linearly amplifying step further comprises the step of linearly amplifying said positive going portion of said differential signals with less than 0.1 percent distortion.

15. An A/D converter subsystem for converting an analog signal to digital words comprising:

a half-linear buffer amplifier for linearly amplifying positive going portions and non-linearly amplifying negative portions of input signals, said half-linear buffer amplifier providing an output signal that has a positive going portion and a negative going portion;

folding amplifiers for amplifying said positive going portion of said output signal, said folding amplifiers providing a single ended output signal based on said positive going portion of said output signal;

a most significant bit (MSB) encoder section for providing most significant output bits based on said single ended output signal; and a least significant bit (LSB) encoder section for providing least significant output bits based on said most significant output bits and said single ended output signal.

16. An A/D converter subsystem as claimed in claim 15 further comprising an error correcting portion for combining said most significant output bits and said least significant output bits to produce a ten bit word output.

17. An A/D converter subsystem as claimed in claim 16 wherein:

said MSB encoder section provides a five bit word;

said LSB encoder section provides a six bit word; and said error correcting portion combines said five bit word and said six bit word to produce a ten bit word output.

18. An A/D converter subsystem as claimed in claim 17 wherein said half-linear buffer amplifier, said folding amplifiers, said MSB encoder section, said LSB encoder section and said error correcting portion are fabricated on a single monolithic substrate.

19. A half-linear buffer amplifier for linearly amplifying positive going portions on an input signal and non-linearly amplifying negative portions of said input signal, said half-linear buffer amplifier comprising:

a first plurality of matched transistors;

a second plurality of matched transistors arranged with said first plurality of matched transistors in a differential amplifier configuration;

a first plurality of diodes in series in collector portion of said first plurality of matched transistors; and a second plurality of diodes in series in collector portion of said second plurality of matched transistors, said half-linear buffer amplifier providing an output signal differentially amplification of said input signal, wherein said first and second pluralities of matched transistors provide a differential output signal that has a positive going portion and a negative going portion, said positive going portion being a linear amplified representation of said input signal to within 0.1 percent, said negative going portion being a non-linear amplified representation of said input signal.

20. A half-linear buffer amplifier as claimed in claim 19 wherein said differential output signal is provided to a ten-bit A/D converter having an input portion that responds only to said positive going portion of said differential output signal.

* * * * *